United States Patent [19]
Glaesel

[11] 4,113,982
[45] Sep. 12, 1978

[54] MEANS FOR MOUNTING ON CHANNEL-SECTION SUPPORTING RAILS

[75] Inventor: Gottfried Glaesel, Minusio, Switzerland

[73] Assignee: Hego Electric GmbH, Glarus, Switzerland

[21] Appl. No.: 680,411

[22] Filed: Apr. 26, 1976

[51] Int. Cl.$^2$ .......................... H05K 7/12; H01R 9/16; H01R 9/22; F16B 2/22

[52] U.S. Cl. ............................. 174/158 R; 248/221.3; 339/198 GA

[58] Field of Search ............... 174/158 R; 339/119 R, 339/198 G, 198 GA, 198 H, 198 K; 248/73, 223, 224, 225, 221.3, 221.4, 223.3, 225.1

[56] References Cited

FOREIGN PATENT DOCUMENTS

| | | | |
|---|---|---|---|
| 2,259,268 | 8/1975 | France | 339/198 GA |
| 1,919,116 | 10/1970 | Fed. Rep. of Germany | 248/223 |
| 2,151,623 | 4/1973 | Fed. Rep. of Germany | 339/198 GA |
| 2,363,008 | 7/1974 | Fed. Rep. of Germany | 248/223 |
| 2,304,817 | 8/1974 | Fed. Rep. of Germany | 339/198 GA |
| 1,409,807 | 10/1975 | United Kingdom | 339/198 GA |

*Primary Examiner*—Laramie E. Askin
*Attorney, Agent, or Firm*—Pollock, Vande Sande & Priddy

[57] ABSTRACT

A mounting arrangement for mounting selectively on a channel-section supporting rail with inwardly turned asymmetrical flanges or outwardly turned symmetrical flanges of different sizes, comprises a mounting foot with a row of four projections of which at least two are resilient.

7 Claims, 8 Drawing Figures

FIG. 5.
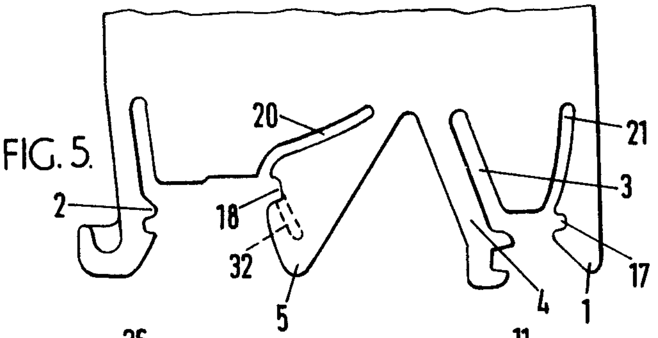
FIG. 6.
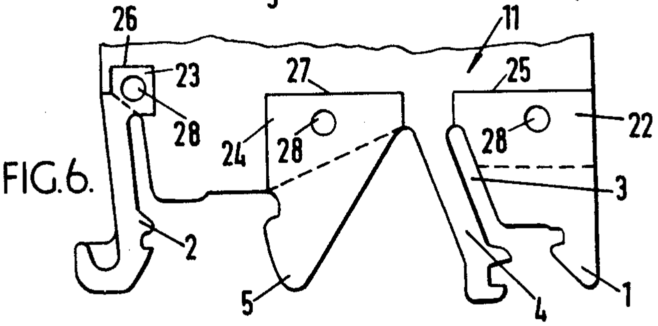
FIG. 7.
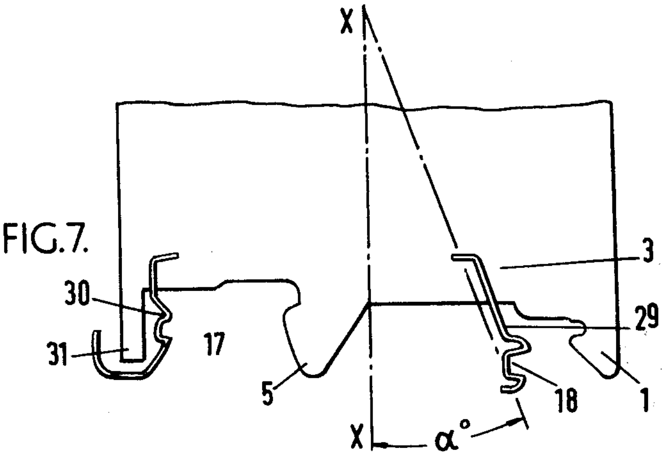
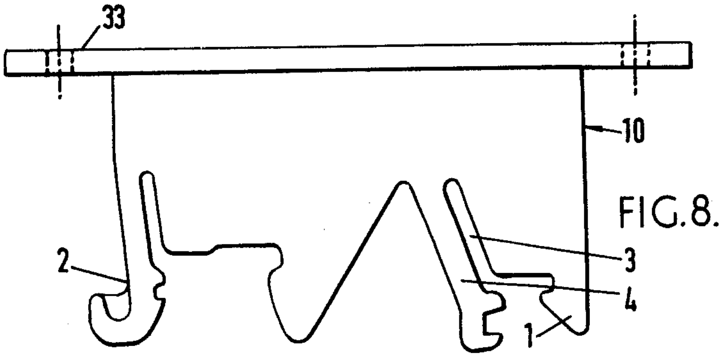
FIG. 8.

MEANS FOR MOUNTING ON CHANNEL-SECTION SUPPORTING RAILS

This invention relates to means for mounting articles on channel-section supporting rails having oppositely directed flanges, for example the well-known clip-on electrical terminals.

Different standard forms of channel-section supporting rails exist. German Industrial Standard DIN 46 277 specifies a rail of asymmetrical cross-section with inwardly turned oppositely directed flanges, the overall width of this rail being 32 mm and the internal width between the edges of the flanges being 16.5 mm. German Standard DIN prEN 50 022 specifies a channel-section rail of symmetrical cross-section with outwardly directed flanges and an overall width of 35 mm. Two forms of this rail are permitted, having respective internal channel widths of 25 and 19.4 mm.

In general, electrical terminals, pneumatic control devices, and associated equipment are designed to be mounted on only one kind of rail, either the asymmetrical cross-section or the symmetrical cross-section rails. It would obviously be convenient if any particular piece of equipment could be mounted, at will, on any of the standard forms of rails, but hitherto it has been possible only to design mounting means capable of being clipped onto either of two out of the three possible kinds of rails, because in general the mounting means provided for clipping onto one kind of rail will foul at least one of the other kinds of rails, because of the similarity of the dimensions of the rails. In particular, it has not been possible to provide equipment capable of being mounted at will on a rail of asymmetrical cross-section or on a rail of symmetrical cross-section with the above-mentioned smaller internal dimensions.

It is an object of the invention to provide an arrangement capable of being mounted at will on any of the three kinds of rails referred to above.

The present invention resides in a mounting foot for mounting selectively on a supporting member of symmetrical channel section with outwardly directed opposite flanges or on a supporting member of asymmetrical channel section with inwardly directed opposite flanges, which foot comprises a row of four projections of which the other two have inward-facing recesses for engaging said outwardly directed flanges, and the inner two have outward-facing recesses for engaging said inwardly directed flanges, alternate projections being rigid and resiliently flexible, respectively.

The invention also resides in a slab-shaped body of electrically insulating material having two spaced-apart major sides, intervening narrow sides, and a foot region for mounting the body detachably on a supporting member of channel section having oppositely directed flanges which are optionally directed each away from the other or each towards the other, the foot region comprising a row of four projections, of which the outer two define respective recesses each open towards the other, and at least one outer projection is resiliently flexible away from the other outer projection for engaging said flanges directed away from each other; the inner two define respective recesses each open towards the adjacent outer projection and at least one inner projection is resiliently flexible towards the other inner projection, for engaging said flanges directed towards each other; and in at least one pair of projections comprising an inner and the adjacent outer projection, at least one projection of the pair being resiliently flexible away from the other.

The present construction enables a projection which is not being used to engage the supporting member used at any particular time to flex if necessary to avoid fouling the supporting member.

The invention will be further described with reference to the accompanying drawings, in which:

FIG. 5 shows a modification of the foot shown in FIG. 1;

FIGS. 6 and 7 show further modifications; and

FIG. 8 shows a mounting block for electrical or pneumatic equipment, incorporating the foot of FIG. 1.

Figure 1:
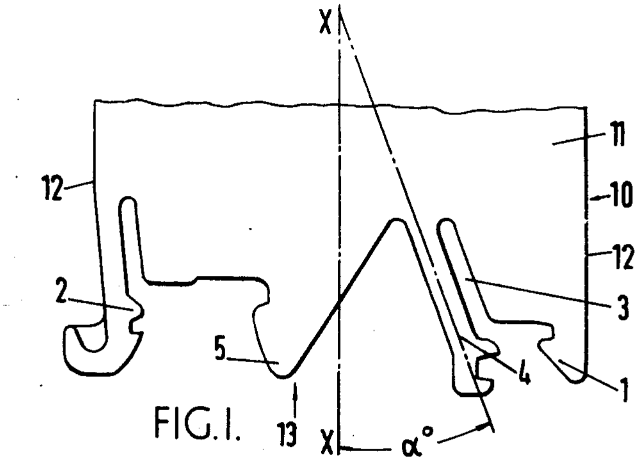
FIG. 1 shows a mounting foot embodying the invention.

FIG. 1 shows the lower part of a slab-shaped body 10 of electrically insulating material, which has two spaced-apart major sides of which the side 11 is visible, and intervening narrow sides 12. The upper part of the body can take various forms according to its desired use. It may for example contain conventional electrical terminals accessible through one or more of the narrow sides of the body.

The body has a foot region 13 by means of which it can be clipped detachably onto a channel-section supporting rail.

Figure 2:
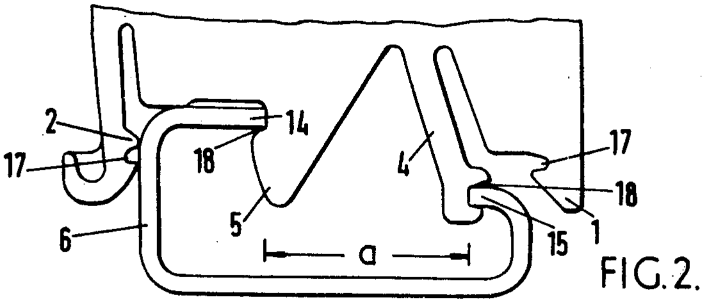
FIGS. 2 to 4 show this mounting foot mounted respectively on three different kinds of channel-section supporting rails.

One form of supporting rail 6 is shown in FIG. 2 and has an asymmetrical cross-section with oppositely directed inwardly turned flanges 14, 15. The standard overall width of this rail is 32 mm, with a gap *a* between the edges of the flanges of 16.5 mm.

Figure 3:
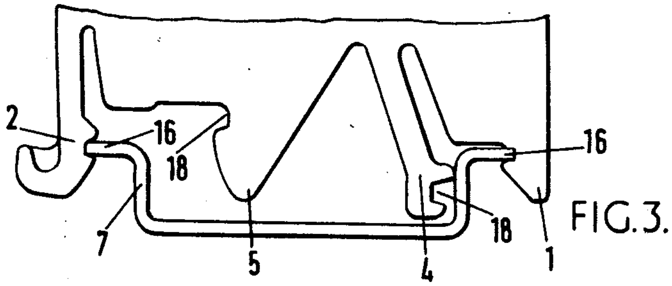

FIG. 3 shows a channel-section rail 7 with opposite outwardly bent flanges 16 and of symmetrical cross-section, the standard dimensions of the rail being: overall width 35 mm, internal width 25 mm, width across the flange 5 mm.

Figure 4:
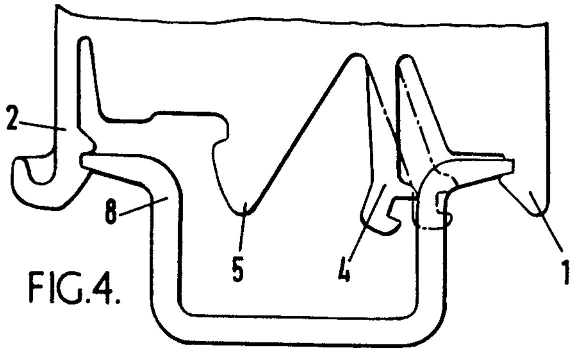

FIG. 4 shows a similar rail 8 of stronger construction, the internal width being only 19.4 mm and the overall width across either flange being 7.8 mm.

For clipping onto these rails, the foot region is provided with a row of four projections respectively 2, 5, 4, 1. The outer projections 1 and 2 have respective recesses 17 facing towards each other, for clipping onto the flanges of a rail 7 or 8, the projection 1 being substantially rigid and the projection 2 being resiliently flexible away from the projection 1.

The inner projections 4, 5 have respective recesses 18 for clipping onto the flanges 14, 15 of the rail 6 shown in FIG. 2. These recesses face outwards, i.e. towards the adjacent outer projections 1, 2. The projection 5 is rigid. The space between it and projection 2 can be made large enough to permit insertion of the flange 14, but in any event the projection 2 can flex to accommodate this side of the rail 6.

The projection 4 is an arm separated from the adjacent outer projection 1 by a simple narrow slot 3. It has been found that the best retention of the body on the supporting rail is obtained if the arm 4 extends at an angle $\alpha$ in the range 15° to 35°, with respect to a line X—X which is perpendicular in use to the base of the rail, i.e., in practice is perpendicular to a line joining the two recesses 17 of the outer projections.

Because of the dimensions of the different rails, it is impossible to provide free access for all of these between the projections of the foot region and in particular, in the embodiment shown in FIGS. 1 to 4, one side of the rail 8 will inevitably foul the arm 4. Mounting on the rail 8 is nevertheless possible because the arm 4 can flex away from the projection 1 to accommodate the rail 8, as shown in FIG. 4. The resulting stress in the arm 4 causes the latter to press against the interior of the rail 8, thereby increasing the security with which the foot region is held on the rail. It will be noted that the arm 4 will also rest close to if not in contact with the interior of the rail 7 shown in FIG. 3 thereby improving the security of this mounting, and in FIG. 2 the arm 2 rests against the outside of the rail 6, again improving the security of the mounting.

The projections are preferably integral with the rest of the foot region, which can be made for example of injection molded resilient plastics or other elastomeric material, for example a polyamide.

The same advantages of secure, interchangeable mounting on the different kinds of supporting rail can be attained using different combinations of rigid and resilient projections. In one possible modification, the projections 2, 4 are rigid and the projections 1, 5 are resilient. In another possible arrangement, only the projection 1 is rigid and the other three projections are flexible. In a fourth possibility, all of the projections are flexible.

By way of example, the projections 1 and 5 can be rendered flexible by the construction shown in FIG. 5, which shows an embodiment in which all of the projections are in fact flexible. The projection 5 is rendered flexible by a narrow slot extending into the foot region from the edge of the latter adjacent to the recess 18 of the projection 5, and the projection 1 is rendered flexible by a narrow slot 21 extending into the foot region from the edge of the latter adjacent to the recess 17 of the projection 1. If these slots 20, 21 are present, either or both of the projections 2, 4 can be made rigid.

It is believed that the combinations of rigid and flexible projections which will permit the foot region to be mounted satisfactorily on all three kinds of supporting rail are those set out in Table 1, in which rigid projections are marked R and resilient projections are marked F.

TABLE 1

| Projection: | 2 | 5 | 4 | 1 |
|---|---|---|---|---|
| | F | R | F | R |
| | R | F | R | F |
| | F | F | F | F |
| | F | F | F | R |
| | R | F | F | F |
| | F | R | F | F |
| | F | F | R | F |

In some circumstances, manufacture can be facilitated if one or more of the projections is not integral with the foot region but consists of a separate insert. For example, in the embodiment shown in FIG. 1, both of the rigid projections may comprise separate inserts, or both of the resilient projections may comprise separate inserts. By way of example only, FIG. 6 shows how the projections 1, 2 and 5 can comprise separate inserts, provided with respective fixing head portions 22, 23, 24 which fit into recesses 25, 26, 27 in the side face 11 and are secured by suitable pins or stakes 28. The profile of the foot region integral with the rest of the body is shown by the broken lines.

In the case of separate inserts to form the resilient projections, these may consist of metal springs, for example shaped leaf springs. Such an arrangement is shown in FIG. 7 in which the projections 1, 5 are rigid and the projections 2, 4 are replaced by metal leaf springs 29, 30, shaped to provide the recesses 17, 18 and adjacent lead-in surfaces. To prevent excessive flexing of these springs, backing members may be provided on the foot region, for example as shown at 31 in respect to the spring 30. The springs 29, 30 may alternatively be metal wire springs.

Numerous other embodiments of the invention are possible. For example, to provide flexibility in the projection 1 or 5, a slot may be provided in the projection itself, for example extending from the associated recess as shown in broken lines at 32 in FIG. 5, in the case of the projection 5.

To enable two or more adjacent bodies 10 to be connected together mechanically to form a block, they may be provided with cooperating locking projections and recesses on their major side faces, for example locking pins or studs and holes.

The upper region of the body, which is not shown in FIGS. 1 to 7, can have any convenient form. FIG. 8 shows a body 10 identical to that of FIG. 1, provided with an integral mounting plate 33 with screw holes, onto which plate electrical, electronic or pneumatic equipment can be secured. Alternatively, as already mentioned, the body may contain conventional electrical terminals. In another embodiment, the body may carry, instead of the mounting plate of FIG. 8, a notched supporting element for receiving identification strips or plates. A body may simply consist of a plate of insulating material for closing off the end of a row of electrical terminal blocks mounted on the same supporting rail, or for preventing movement of the blocks along the rail.

It will be seen that I have provided a mounting arrangement capable of fitting at will to any of the three different kinds of supporting rail, and in which security of mounting is assured by virtue of the fact that, in addition to the two projections which engage the rail flanges, the rail is also engaged by a third resilient projection (the projection 2 in FIG. 2 and the projection 4 in FIGS. 3 and 4), the resilient stress in which increases the security of the mounting.

I claim:

1. A mounting foot for mounting selectively on (a) a supporting member of symmetrical channel section with outwardly directed opposite flanges of a first width, (b) a supporting member of symmetrical channel section with outwardly directed opposite flanges of a second width, and (c) a supporting member of asymmetrical channel section with inwardly directed opposite flanges, said foot comprising a row of two outer and two inner projections, said outer two projections having inwardly facing recesses for engaging said outwardly directed flanges, and said inner two projections having outwardly facing recesses for engaging said inwardly directed flanges, alternate projections being rigid and resiliently flexible, respectively, said inwardly facing recesses defining an interconnecting line, a first said inner projection being rigid and having its said recess above said line and the second said inner projection comprising a resiliently flexible finger, said recess in said second inner projection comprising a notch below said line, the spacing between said first inner projection and the immediately adjacent outer projection being substantially greater than the spacing between said second inner projection and the outer projection immediately adjacent thereto.

2. A mounting foot according to claim 1, wherein said second inner projection is separated from the adjacent outer projection solely by a slot.

3. A mounting foot according to claim 1, wherein the finger extends obliquely at an angle of 15° to 35° to a line perpendicular to said interconnecting line.

4. A mounting foot according to claim 1, which comprises elastomeric material.

5. A mounting foot according to claim 1, wherein at least one said projection is a separate insert.

6. A mounting foot according to claim 5, wherein said insert comprises an inserted metal spring constituting a resilient projection.

7. A slab-shaped body of electrically insulating material having two spaced-apart major sides, intervening narrow sides, and a foot region for selectively mounting the body detachably on (a) a supporting member of symmetrical channel section with outwardly directed opposite flanges of a first width, (b) a supporting member of symmetrical channel section with outwardly directed opposite flanges of a second width, and (c) a supporting member of asymmetrical channel section with inwardly directed opposite flanges, said foot region comprising a row of two outer and two inner projections, said outer projections defining respective recesses each open towards the other, one of said outer projections being resiliently flexible away from the other outer projection for engaging said flanges directed away from each other, said two inner projections defining respective recesses each open towards the adjacent outer projection, one said inner projection being resiliently flexible towards the other said inner projection, for engaging said flanges directed towards each other; and in each pair of projections comprising an inner and the immediately adjacent outer projection one projection of the pair being resiliently flexible away from the other and one projection being rigid, said inward-facing recesses defining an interconnecting line, a first said inner projection being rigid and having its said recess above said line and the second said inner projection comprising a resiliently flexible finger, said recess in said second inner projection comprising a notch below said line, the spacing between said first inner projection and the immediately adjacent outer projection being substantially greater than that between the second inner projection and the outer projection immediately adjacent thereto.

* * * * *